(12) United States Patent
Kioussis et al.

(10) Patent No.: US 9,871,193 B2
(45) Date of Patent: Jan. 16, 2018

(54) METHODS OF PRODUCING AND CONTROLLING TUNNELING ELECTRORESISTANCE AND TUNNELING MAGNETORESISTANCE IN A MULTIFERROIC TUNNEL JUNCTION

(71) Applicant: California State University Northridge, Northridge, CA (US)

(72) Inventors: Nicholas Kioussis, Northridge, CA (US); Julian Velev, San Juan, PR (US); Alan Kalitsov, San Jose, CA (US); Artur Useinov, Kazan (RU)

(73) Assignee: CALIFORNIA STATE UNIVERSITY, NORTHRIDGE, Northridge, CA (US)

( * ) Notice: Subject to any disclaimer, the term of this patent is extended or adjusted under 35 U.S.C. 154(b) by 0 days.

(21) Appl. No.: 14/818,075

(22) Filed: Aug. 4, 2015

(65) Prior Publication Data
US 2016/0043307 A1     Feb. 11, 2016

Related U.S. Application Data

(60) Provisional application No. 62/035,171, filed on Aug. 8, 2014.

(51) Int. Cl.
*G11C 11/22* (2006.01)
*H01L 43/10* (2006.01)
(Continued)

(52) U.S. Cl.
CPC .......... *H01L 43/10* (2013.01); *G11C 11/161* (2013.01); *G11C 11/1675* (2013.01);
(Continued)

(58) Field of Classification Search
CPC ......... H01L 43/10; H01L 43/02; H01L 43/08; G11C 11/2275; G11C 11/5607;
(Continued)

(56) References Cited

U.S. PATENT DOCUMENTS

2009/0050949 A1\* 2/2009 Maruyama ............. G11C 11/22
                                                              257/295
2009/0067224 A1\* 3/2009 Hochstrat ............... G11C 11/16
                                                              365/158
(Continued)

OTHER PUBLICATIONS

Velev, et al. Magnetic tunnel junctions with ferroelectric barriers. Nano Lett., 9(1), 427-432 (2009).
Garcia, et al. Giant tunnel electroresistance for non-destructive readout of ferroelectric states. Nature 460, 81-84 (2009).
Parkin, et al. Giant tunnelling magnetoresistance at room temperature with MgO (100) tunnel barriers. Nature Materials 3, 862-67 (2004).
(Continued)

*Primary Examiner* — Khamdan Alrobaie
(74) *Attorney, Agent, or Firm* — Merle W. Richman; TechLaw LLP

(57) ABSTRACT

The present invention relates to magnetic random access memory (MRAM) storage devices based on multiferroic tunnel junctions in which ferroelectric polarization is used to control and manipulate the memory state. Invention methods include: (1) method of producing tunneling electroresistance (TER) effect in multiferroic tunnel junction (MFTJ) at finite bias; (2) method of controlling the TER effect in an MFTJ at infinite bias via the switching of the relative orientation of the ferromagnetic leads; (3) method of producing monotonous bias dependence of the tunneling magnetoresistance (TMR) in a MFTJ; (4) method of controlling the size and direction of the parallel spin transfer torque (STT) component and the perpendicular STT component across the MFTJ; (5) method of producing a monotonous bias dependence of the perpendicular STT component across an MFTJ; and (6) method of controlling the size and sign of the interlayer exchange coupling in an MFTJ. The invented products are any electric-field-controlled spin transfer torque magnetoresistive memory element based on a multiferoic tunnel junction (MTFJ) with magnetic electrodes and a simple or composite ferroelectric barrier embodying any of the claimed 6 methods.

9 Claims, 11 Drawing Sheets

(51) Int. Cl.
  *H01L 43/08* (2006.01)
  *G11C 11/16* (2006.01)
  *G11C 11/56* (2006.01)
(52) U.S. Cl.
  CPC .......... *G11C 11/22* (2013.01); *G11C 11/2275* (2013.01); *G11C 11/5607* (2013.01); *G11C 11/5657* (2013.01); *H01L 43/08* (2013.01); *G11C 2213/71* (2013.01)
(58) Field of Classification Search
  CPC . G11C 11/22; G11C 11/1675; G11C 11/5657; G11C 11/161; G11C 2213/71
  See application file for complete search history.

(56) References Cited

U.S. PATENT DOCUMENTS

| | | | | |
|---|---|---|---|---|
| 2009/0302886 A1* | 12/2009 | Karg | .................. | G11C 11/16 326/37 |
| 2010/0102369 A1* | 4/2010 | Tian | .................. | G11C 11/22 257/295 |
| 2012/0069648 A1* | 3/2012 | Kramer | ............... | H01L 27/228 365/171 |
| 2014/0043895 A1* | 2/2014 | Bibes | .................. | H01L 43/08 365/171 |
| 2014/0321199 A1* | 10/2014 | Han | ................... | G11C 13/0002 365/158 |
| 2015/0333258 A1* | 11/2015 | Fujii | .................. | G11C 11/22 257/421 |

OTHER PUBLICATIONS

Yuasa, et al. Giant room-temperature magnetoresistance in single-crystal Fe/MgO/Fe magnetic tunnel junctions. Nature Materials 3, 868-71 (2004).
Kubota, et al. Quantitative measurement of voltage dependence of spin-transfer torque in MgO-based magnetic tunnel junctions. Nature Physics 4, 37-41 (2008).
Sankey, et al. Measurement of the spin-transfer-torque vector in magnetic tunnel junctions. Nature Physics 4, 67-71 (2008).
Slonczewski, J.C. Conductance and exchange coupling of two ferromagnets separated by a tunneling barrier. Physical Review B 39, 6995-7002. (1989).
Butler, et al. Spin-dependent tunneling conductance of Fe—MgO—Fe sandwiches. Physical Review B 63(054416), 1-12 (2001).
Zhuralev, et al. Effect of spin-dependent screening on tunneling electroresistance and tunneling magnetoresistance in multiferroic tunnel junctions. Physical Review 13 81(104419), 1-7 (2010).
Zhuralev, et al. Giant electroresistance in ferroelectric tunnel junctions. Physical Review Letters 94(246802), 1-4 (2005).
Velev, et al. Effect of ferroelectricity on electron transport in Pt-BTO-Pt tunnel junctions. Physical Review Letters 98 (137201), 1-4 (2007).
Garcia, et al. Ferroelectric control of spin polarization. Science 327, 1106-10 (2010).
Maksymovych, et al. Polarization Control of Electron Tunneling into Ferroelectric Surfaces. Science, 324, 1421-25 (2009).

* cited by examiner

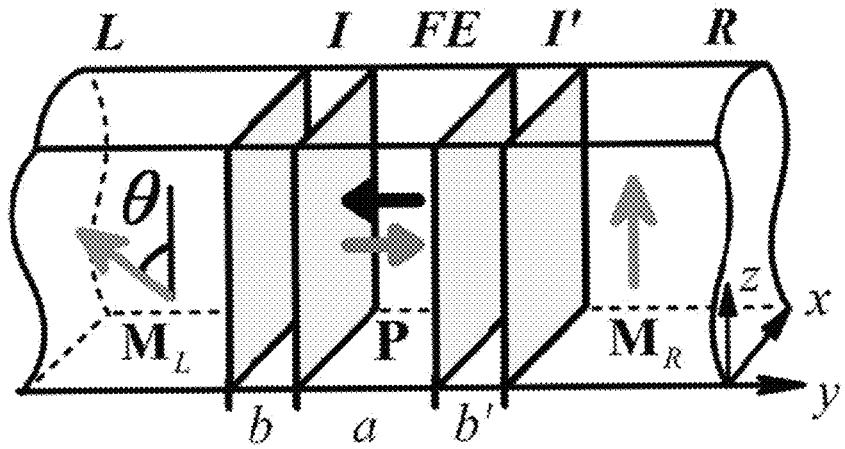

FIG. 1: Schematic representation of a MFTJ with two FM layers separated by a FE barrier. The magnetization of the right (R) layer $M_R$ is along z, whereas the magnetization of the left (L) layer $M_L$ is rotated around the y axis by an angle θ. The polarization in the barrier P is perpendicular to the interface.

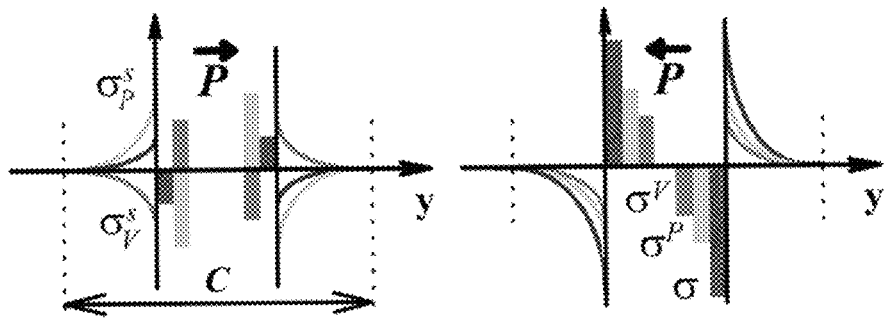

FIG. 2(a)      FIG. 2(b)

The total, $\sigma^s$, polarization-induced, $\sigma_P^s$, and bias-induced, $\sigma_V^s$, screening charge densities at the same bias for (FIG. 2a) positive and (FIG. 2b) negative polarization. C refers to the central scattering region consisting of the barrier and the part of the left and right FM electrodes in which the screening takes place.

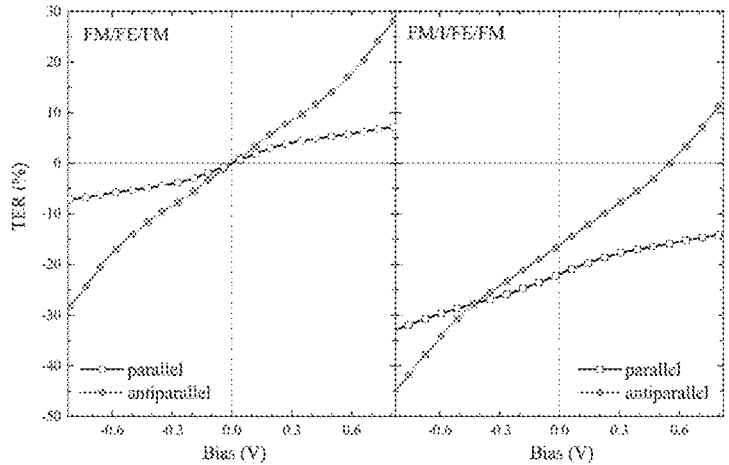

FIG. 3(a) FIG. 3(b)

Bias dependence of TER in a symmetric FM/FE/FM MFTJ (FIG.3(a)) and an asymmetric FM/I/FE/FM MFTJ (FIG. 3(b)). The FE thickness is a = 1.0 nm and the polarization P = 30.0 μC/cm². The thickness of the dielectric I is b = 0.6 nm. The open and filled symbols denote the TER for parallel and antiparallel alignment of the magnetizations in the FM slabs in the two cases.

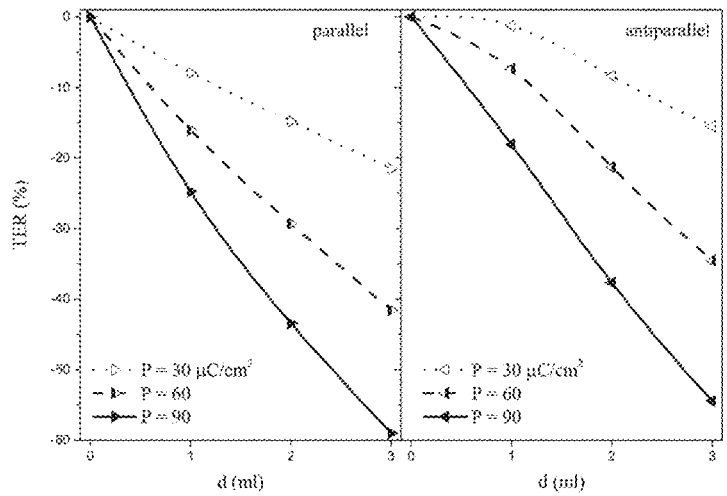

FIG. 4(a) FIG. 4(b)

Polarization and dielectric thickness dependence of TER in an asymmetric FM/I/FE/FM MFTJ. The thickness of the FE slab is a = 1.0 nm. The two graphs represent the parallel (FIG. 4(a)) and antiparallel (FIG. 4(b)) orientation of the magnetization in the FM slabs.

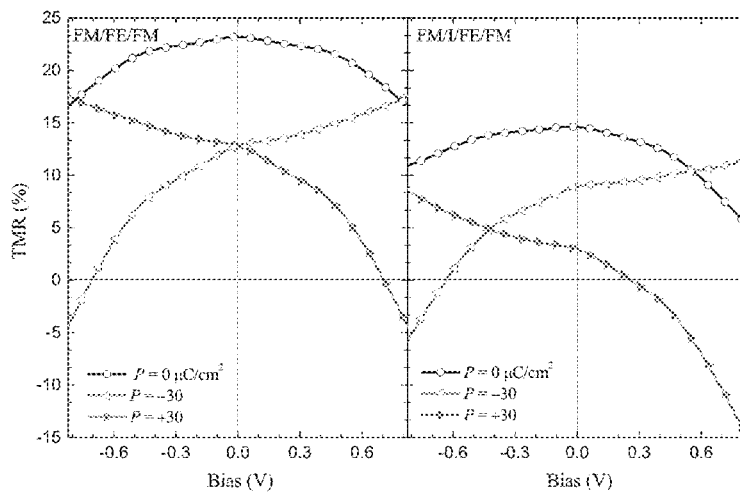

FIG. 5(a) FIG. 5(b)

Bias dependence of TMR in a symmetric FM/FE/FM MFTJ (FIG. 5(a)) and an asymmetric FM/I/FE/FM MFTJ (FIG. 5(b)). The thickness of the FE slab is a = 1.0 nm and the polarization P = 30.0 μC/cm². The thickness of the dielectric slab is b = 0.6 nm. The case of a passive barrier, i.e. P = 0.0 μC/cm², is given as reference (circles). The two directions of the polarization are shown (left and right pointing triangles).

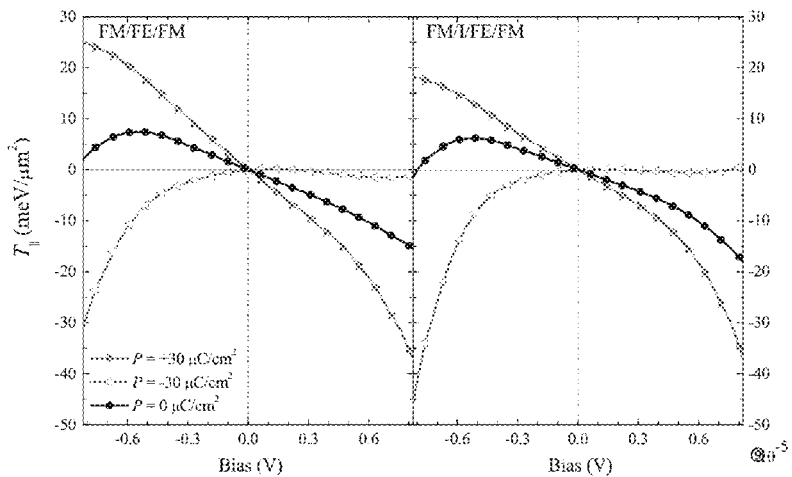

FIG. 6(a) FIG. 6(b)

Bias dependence of the parallel STT in a symmetric FM/FE/FM MFTJ (FIG. 6(a)) and an asymmetric FM/I/FE/FM MFTJ (FIG. 6(b)). The thickness of the FE slab is a = 1.0 nm and the polarization P = 30.0 μC/cm². The thickness of the dielectric slab is b = 0.6 nm. The passive barrier case, P = 0.0 μC/cm², is given as reference (circles). The two directions of the polarization are shown (left and right triangles).

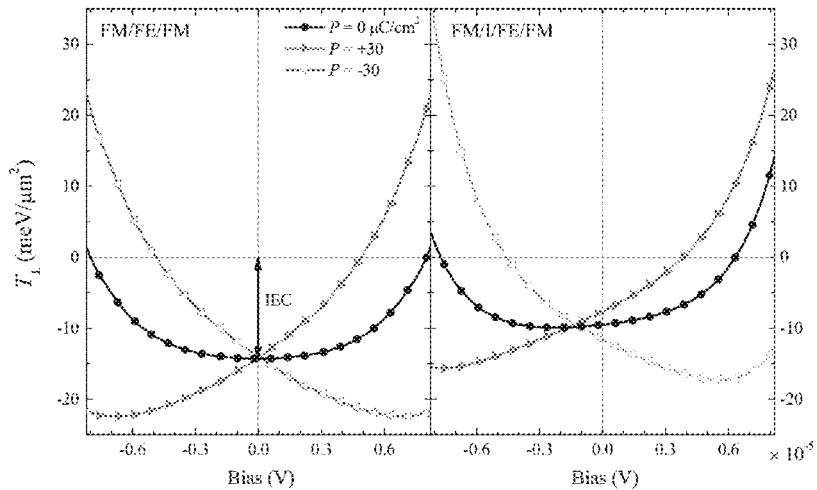

FIG. 7(a)    FIG. 7(b)

Bias dependence of the perpendicular STT in a symmetric FM/FE/FM MFTJ (FIG. 7(a)) and an asymmetric FM/I/FE/FM MFTJ (FIG. 7(b)). The thickness of the FE slab is a = 1.0 nm and the polarization P = 30.0 µC/cm². The thickness of the dielectric slab is b = 0.6 nm. The passive barrier case, P = 0.0 µC/cm², is given as reference (circles). The two directions of the polarization are shown (left and right pointing triangles).

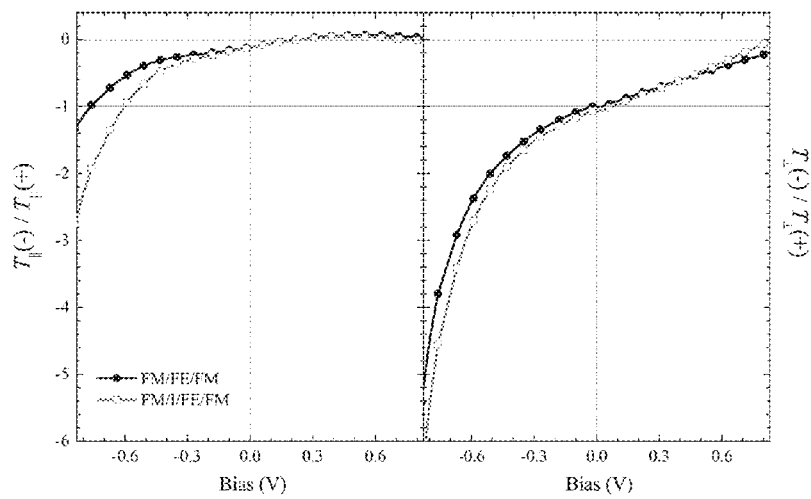

FIG. 8(a)    FIG. 8(b)

Ratio of in-plane component of STT for negative and positive polarization as a function of bias (FIG. 8(a)). Ratio of out-of-plane component of STT for negative and positive polarization as a function of bias (FIG. 8(b)) for symmetric FM/FE/FM and asymmetric FM/I/FE/FM MFTJs. The thickness of the FE slab is a = 1.0 nm and the polarization P = 30.0 µC/cm². The thickness of the dielectric slab is b = 0.6 nm.

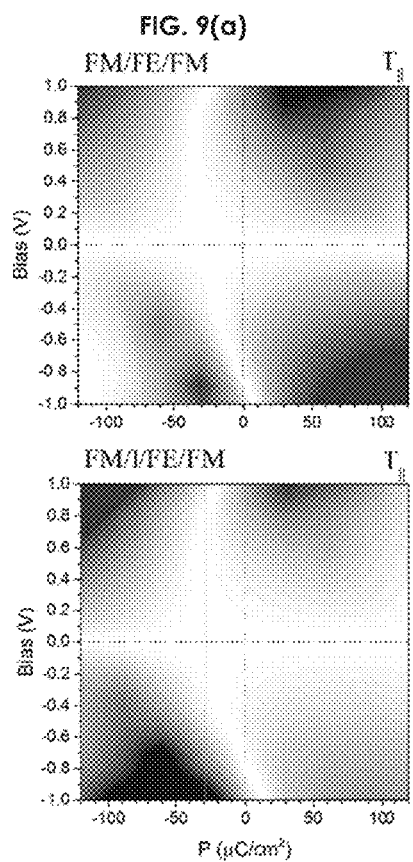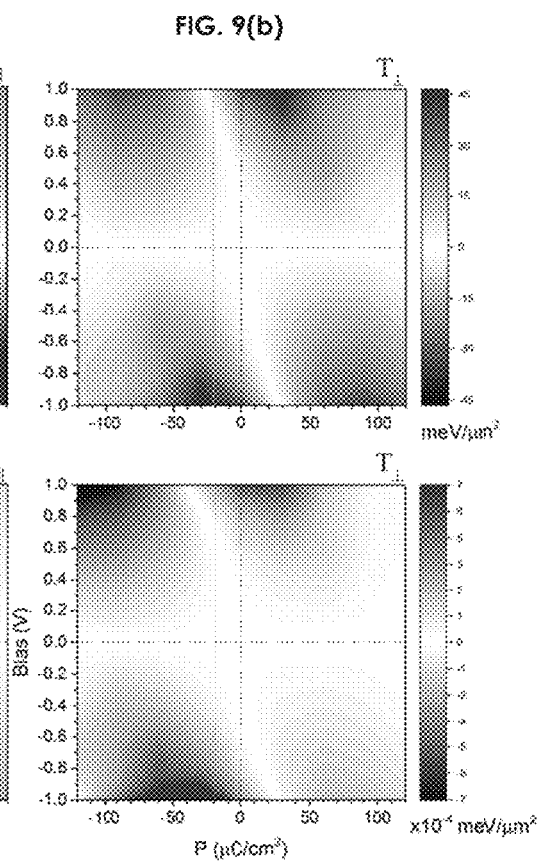
Polarization versus bias dependence phase diagram of both the parallel and perpendicular components of the STT in a symmetric FM/FE/FM MFTJ (FIGS. 9(a) and 9(b)) and an asymmetric FM/I/FE/FM MFTJ (FIGS. 9(c) and 9(d)). The thickness of the FE slab is a = 1.0 nm and the thickness of the dielectric slab is b = 0.6 nm.

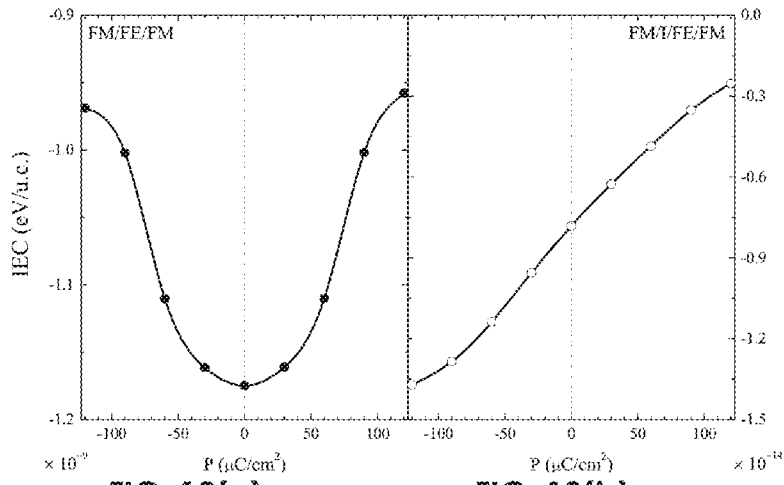

FIG. 10(a) FIG. 10(b)

IEC in the presence of polarization in the barrier in a symmetric FM/FE/FM MFTJ (FIG. 10(a)) and an asymmetric FM/I/FE/FM MFTJ (FIG. 10(b)). The thickness of the FE slab is a = 1.0 nm and the thickness of the dielectric slab is b = 0.6 nm.

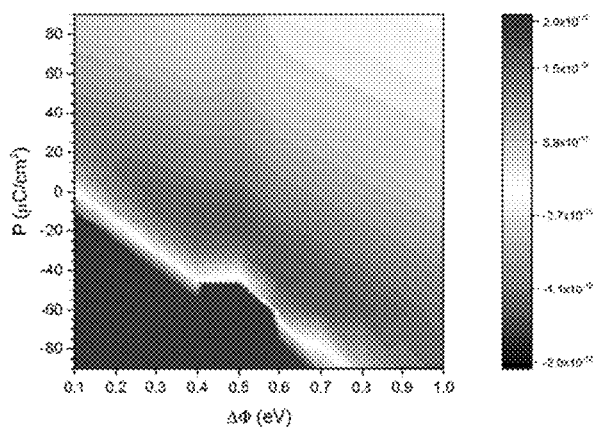

FIG. 11

Polarization versus dielectric barrier height phase diagram of the IEC in FM/I/FE/FM MFTJs with a composite barrier. The thickness of the FE slab is a = 1.0 nm and the thickness of the dielectric slab is b = 0.6 nm. The barrier height $\Delta\Phi$ is given in electronvolts above the Fermi level.

METHODS OF PRODUCING AND CONTROLLING TUNNELING ELECTRORESISTANCE AND TUNNELING MAGNETORESISTANCE IN A MULTIFERROIC TUNNEL JUNCTION

FEDERALLY SPONSORED RESEARCH OR DEVELOPMENT

This invention was made with United States Government support under "PREM—Computational Research and Education for Emergent Materials," Award No. DMR-1205734 and "Collaborative Research: Cyberinfrastructure-enabled Computational Nanoscience for Energy Technologies," Award No. EPS-1010094, both awarded by the National Science Foundation. The United States Government has certain rights in the invention.

BACKGROUND

A. Field of the Invention

Embodiments of the present invention are related to memory storage devices and computing devices employing such memory storage devices. In particular, the present invention relates to magnetic random access memory (MRAM) storage devices based on multiferroic tunnel junctions.

B. Description of the Prior Art

Spintronics is a field of electronics which aims at utilizing the spin of the electron in addition to its charge for memory and logic applications. Due to advancements in spintronics, information storage has experienced tremendous growth in the past decade. In particular, magnetic random access memory (MRAM) is an emerging technology which could provide a non-volatile and energy-efficient alternative to the traditional dynamic random access memory (DRAM). In MRAM memory bits the state is stored in the relative orientation (parallel or antiparallel) of the magnetization of two ferromagnetic (FM) thin films separated by a thin non-magnetic insulator. Such devices are referred to as magnetic tunnel junctions (MTJs) which have the unique and important property of having their resistance change as the relative orientation of the magnetizations switches from parallel to antiparallel. This phenomenon, referred to as the tunneling magnetoresistance (TMR), is the foundation of MRAM applications. The TMR is defined by, $TMR \equiv (I_P - I_{AP})/I_{AP}$, where $I_{AP}$ ($I_P$) is the current for the antiparallel (parallel) relative magnetization orientation of the two FM films (W. H. Butler, et al., Phys. Rev. B 63, 054416 (2001). S. S. P. Parkin, et al., Nat. Mater. 3, 862 (2004); S. Yuasa, et al., Nat. Mater. 3, 868 (2004).).

Switching the magnetization orientation is normally achieved by an external magnetic field which hinders the miniaturization of MRAM and is not energy efficient. An alternative mechanism involves driving a spin-polarized current through the device which induces a spin transfer torque (STT) (J. C. Slonczewski, Phys. Rev. B 39, 6995 (1989). H. Kubota, et al., Nature Phys. 4, 37 (2008); J. C. Sankey, et al., Nature Phys. 4, 67 (2008).)

The STT is the transfer of spin angular momentum between the non-collinear magnetizations of the FM layers. Even though this mechanism simplifies the device design it still requires high electric currents for magnetization switching which, in turn, result in high power consumption.

Recently, ferroelectric tunnel junctions (FTJs), consisting of metal electrodes with a thin ferroelectric (FE) barrier, have been shown to change resistance in electric field (M. Y. Zhuravlev, et al., Phys. Rev. Lett. 94, 246802 (2005); J. P. Velev, et al., Phys. Rev. Lett. 98, 137201 (2007). Zhuravlev, et al., Phys. Rev. B 81, 104419 (2010). V. Garcia et al., Nature 460, 81 (2009); P. Maksymovych, et al., Science 324, 1421 (2009). J. P. Velev, et al., Nano Lett. 9, 427 (2009). V. Garcia, et al., Science 327, 1106 (2010).).

The effect described above in paragraph [0006] is called tunneling electroresistance (TER) and is defined by $TER \equiv (I_\rightarrow - I_\leftarrow)/(I_\rightarrow + I_\leftarrow)$, where $I_{\leftarrow(\rightarrow)}$ is the total charge current when the polarization points to the right (left). The underlying mechanism lies in the asymmetric screening of the polarization bound charge at the two metal/FE interfaces upon switching the ferroelectric polarization in the barrier. Moreover, multiferroic tunnel junctions (MFTJs), which can be thought alternatively as MTJs with FE barriers or as FTJs with FM electrodes, show simultaneous TER and TMR effects. More importantly in MFTJs the electric control of the spin-polarized charge current and TMR is realized via the dependence of the current on the polarization direction in the barrier.

The digital era requires electronic memory storage that is reliable, quick, energy efficient, and appropriately sized for the application. Current MRAM storage devices require high electric currents, and therefore tend to be not very energy efficient. Also, it tends to be difficult to make efficient, reliable MRAM devices that are small enough for efficient use in various applications.

Thus, a need exists in the art for improved MRAM storage devices and associated methods and apparatus.

SUMMARY OF THE INVENTION

One of the invented methods is a method of producing tunneling electroresistance (TER) effect in a multiferroic tunnel junction (MFTJ) at finite bias by establishing an MFTJ having a ferroelectric (FE) barrier with a FE polarization, wherein the MFTJ is at finite bias, and switching the FE polarization. The MFTJ may be symmetric or asymmetric. Also, the MFTJ may have a composite asymmetric dielectric/ferroelectric barrier with a FE polarization. The switching step may be accomplished by applying an external electric field pulse.

Another invented method is a method of controlling the tunneling electroresistance (TER) effect in a multiferroic tunnel junction (MFTJ) at finite bias by establishing an MFTJ at finite bias having two magnetic leads having an original relative magnetization orientation, and switching the original relative orientation to a second relative magnetization orientation. The original relative magnetization orientation may be parallel and the second relative magnetization orientation may be antiparallel, or the original relative magnetization orientation may be antiparallel and the second relative magnetization orientation may be parallel.

Yet another invented method is a method of producing a monotonous bias dependence of a tunneling magnetoresistance (TMR) effect in a multiferroic tunnel junction (MFTJ) by establishing an MFTJ having a ferroelectric (FE) barrier with a FE polarization. The TMR effect may have a slope, and the slope may be controlled by switching the FE polarization by applying an external electric field pulse.

Still another invented method is a method of controlling the size and the direction of a parallel spin transfer torque (STT) component across a multiferroic tunnel junction (MFTJ) and the size and the direction of a perpendicular STT component across an MFTJ by establishing an MFTJ having a ferroelectric (FE) barrier with a FE polarization, and switching the FE polarization. The switching step may be accomplished by applying an external electric field pulse.

One more invented method is a method of producing a monotonous bias dependence of the perpendicular spin transfer torque (STT) component across a multiferroic tunnel junction (MFTJ) by establishing an MFTJ having a ferroelectric (FE) barrier with a FE polarization. The perpendicular STT component may have a slope, and the slope may be controlled by switching the FE polarization by applying an external electric field pulse.

Another invented method is a method of controlling the size and the sign of the interlayer exchange coupling (IEC) in an multiferroic tunnel junction (MFTJ) by establishing an MFTJ having a ferroelectric (FE) barrier with a FE polarization, and switching the FE polarization. MFTJ may be symmetric or asymmetric. The switching step may be accomplished by applying an external electric field pulse.

An invented product may be an electric-field-controlled spin transfer torque magnetoresistive memory element based on a multiferroic tunnel junction (MFTJ) with magnetic electrodes and a simple or a composite ferroelectric barrier embodying any of the invented methods. An invented electric-field-controlled spin transfer torque magnetoresistive memory element may have a composite ferroelectric barrier with one of the following: a ferroelectric barrier in contact to a left insulating material, a ferroelectric barrier in contact with a right insulating material, and a ferroelectric barrier in contact to both a left insulating material and to a right insulating material.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 is a schematic diagram of the magnetizations and ferroelectric polarization of an MFTJ with two FM layers separated by a FE barrier.

FIG. 2(a) is a chart showing the total, $\sigma^s$, polarization-induced, $\sigma_P^s$, and bias-induced, $\sigma_V^s$, screening charge densities at the same bias for positive polarization. C refers to the central scattering region consisting of the total barrier and the part of the left and right FM electrodes in which the screening takes place.

FIG. 2(b) is a chart showing the total, $\sigma^s$, polarization-induced, $\sigma_P^s$, and bias-induced, $\sigma_V^s$, screening charge densities at the same bias for negative polarization. C refers to the central scattering region consisting of the total barrier and the part of the left and right FM electrodes in which the screening takes place.

Figure 12:
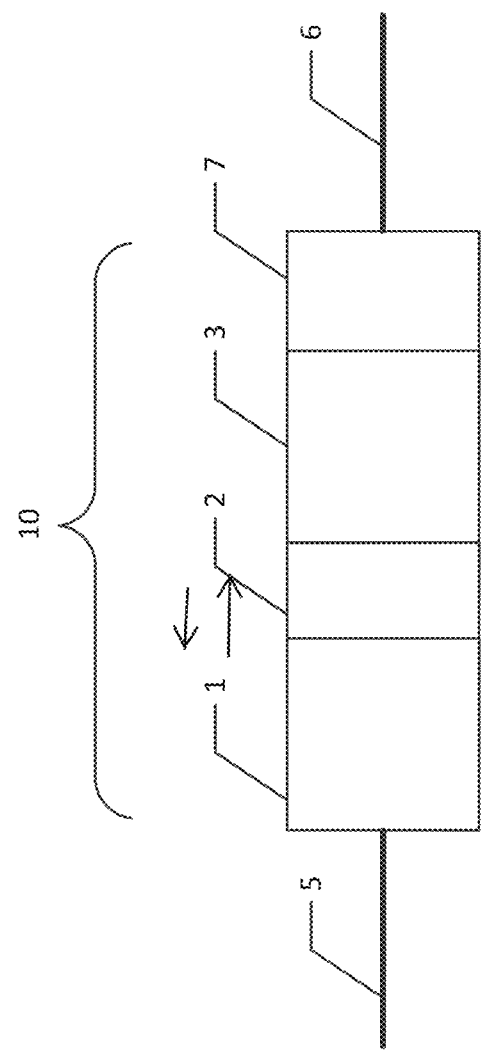

FIG. 3(a) is a chart showing the bias dependence of TER in a symmetric FM/FE/FM MFTJ. The FE thickness is a=1.0 nm and the polarization P=30.0 μC/cm². The open and filled symbols denote the TER for parallel and antiparallel alignment of the magnetizations in the FM slabs in the two cases.

FIG. 3(b) is a chart showing the bias dependence of TER in an asymmetric FM/I/FE/FM MFTJ. The FE thickness is a=1.0 nm and the polarization P=30.0 μC/cm². The thickness of the dielectric I is b=0.6 nm. The open and filled symbols denote the TER for parallel and antiparallel alignment of the magnetizations in the FM slabs in the two cases.

FIG. 4(a) is a chart showing the polarization and dielectric thickness dependence of TER in an asymmetric FM/I/FE/FM MFTJ, where the FM slabs are in parallel magnetic orientation.

FIG. 4(b) is a chart showing the polarization and dielectric thickness dependence of TER in an asymmetric FM/I/FE/FM MFTJ, where the FM slabs are in antiparallel magnetic orientation.

FIG. 5(a) is a chart showing the bias dependence of TMR in a symmetric FM/FE/FM MFTJ. The thickness of the FE slab is a=1.0 nm and the polarization P=30.0 μC/cm². The case of a passive barrier, i.e. P=0.0 μC/cm², is given as reference (circles). The two directions of the polarization are shown (left and right pointing triangles).

FIG. 5(b) is a chart showing the bias dependence of TMR in an asymmetric FM/I/FE/FM MFTJ. The thickness of the FE slab is a=1.0 nm and the polarization P=30.0 μC/cm². The thickness of the dielectric slab is b=0.6 nm. The case of a passive barrier, i.e. P=0.0 μC/cm², is given as reference (circles). The two directions of the polarization are shown (left and right pointing triangles).

FIG. 6(a) is a chart showing the bias dependence of the parallel STT in a symmetric FM/FE/FM MFTJ. The thickness of the FE slab is a=1.0 nm and the polarization P=30.0 μC/cm². The passive barrier case, P=0.0 μC/cm², is given as reference (circles). The two directions of the polarization are shown (left and right triangles).

FIG. 6(b) is a chart showing the bias dependence of the parallel STT in an asymmetric FM/I/FE/FM MFTJ (right). The thickness of the FE slab is a=1.0 nm and the polarization P=30.0 μC/cm². The thickness of the dielectric slab is b=0.6 nm. The passive barrier case, P=0.0 μC/cm², is given as reference (circles). The two directions of the polarization are shown (left and right triangles).

FIG. 7(a) is a chart showing the bias dependence of the perpendicular STT in a symmetric FM/FE/FM MFTJ. The thickness of the FE slab is a=1.0 nm and the polarization P=30.0 μC/cm². The passive barrier case, P=0.0 μC/cm², is given as reference (circles). The two directions of the polarization are shown (left and right pointing triangles).

FIG. 7(b) is a chart showing the bias dependence of the perpendicular STT in an asymmetric FM/I/FE/FM MFTJ. The thickness of the FE slab is a=1.0 nm and the polarization P=30.0 μC/cm². The thickness of the dielectric slab is b=0.6 nm. The passive barrier case, P=0.0 μC/cm², is given as reference (circles). The two directions of the polarization are shown (left and right pointing triangles).

FIG. 8(a) is a chart showing the ratio of the in-plane component of STT for negative and positive polarization as a function of bias for symmetric FM/FE/FM and asymmetric FM/I/FE/FM MFTJs. The thickness of the FE slab is a=1.0 nm and the polarization P=30.0 μC/cm². The thickness of the dielectric slab is b=0.6 nm.

FIG. 8(b) is a chart showing the ratio of the out-of-plane component of STT for negative and positive polarization as a function of bias for symmetric FM/FE/FM and asymmetric FM/I/FE/FM MFTJs. The thickness of the FE slab is a=1.0 nm and the polarization P=30.0 μC/cm². The thickness of the dielectric slab is b=0.6 nm.

FIG. 9(a) is a chart showing the polarization versus bias dependence phase diagram of the parallel component of the STT in a symmetric FM/FE/FM MFTJ. The thickness of the FE slab is a=1.0 nm and the thickness of the dielectric slab is b=0.6 nm.

FIG. 9(b) is a chart showing the polarization versus bias dependence phase diagram of the perpendicular component of the STT in a symmetric FM/FE/FM MFTJ. The thickness of the FE slab is a=1.0 nm and the thickness of the dielectric slab is b=0.6 nm.

FIG. 9(c) is a chart showing the polarization versus bias dependence phase diagram of the parallel component of the STT in an asymmetric FM/I/FE/FM MFTJ. The thickness of the FE slab is a=1.0 nm and the thickness of the dielectric slab is b=0.6 nm.

FIG. 9(d) is a chart showing the polarization versus bias dependence phase diagram of the perpendicular component of the STT in an asymmetric FM/I/FE/FM MFTJ. The thickness of the FE slab is a=1.0 nm and the thickness of the dielectric slab is b=0.6 nm.

FIG. 10(a) is a chart showing the IEC in the presence of polarization in the barrier in a symmetric FM/FE/FM MFTJ. The thickness of the FE slab is a=1.0 nm and the thickness of the dielectric slab is b=0.6 nm.

FIG. 10(b) is a chart showing the IEC in the presence of polarization in the barrier in an asymmetric FM/I/FE/FM MFTJ. The thickness of the FE slab is a=1.0 nm and the thickness of the dielectric slab is b=0.6 nm.

FIG. 11 is a chart showing polarization versus dielectric barrier height phase diagram of the IEC in FM/I/FE/FM MFTJs with a composite barrier. The thickness of the FE slab is a=1.0 nm and the thickness of the dielectric slab is b=0.6 nm. The barrier height $\Delta\Phi$ is given in electronvolts above the Fermi level.

Figure 13:
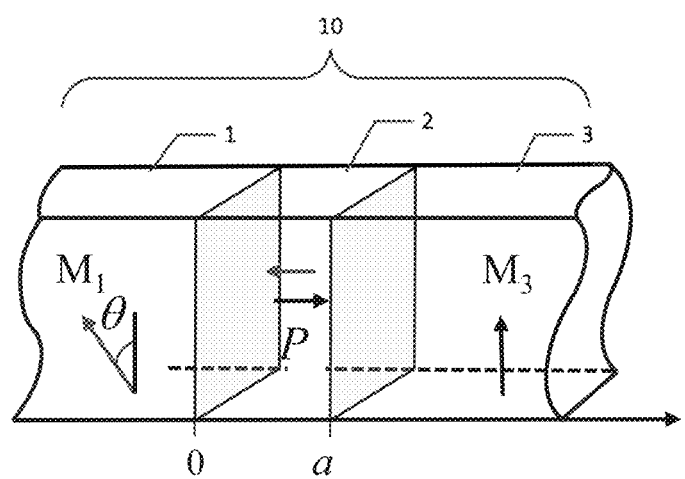
Figure 14:
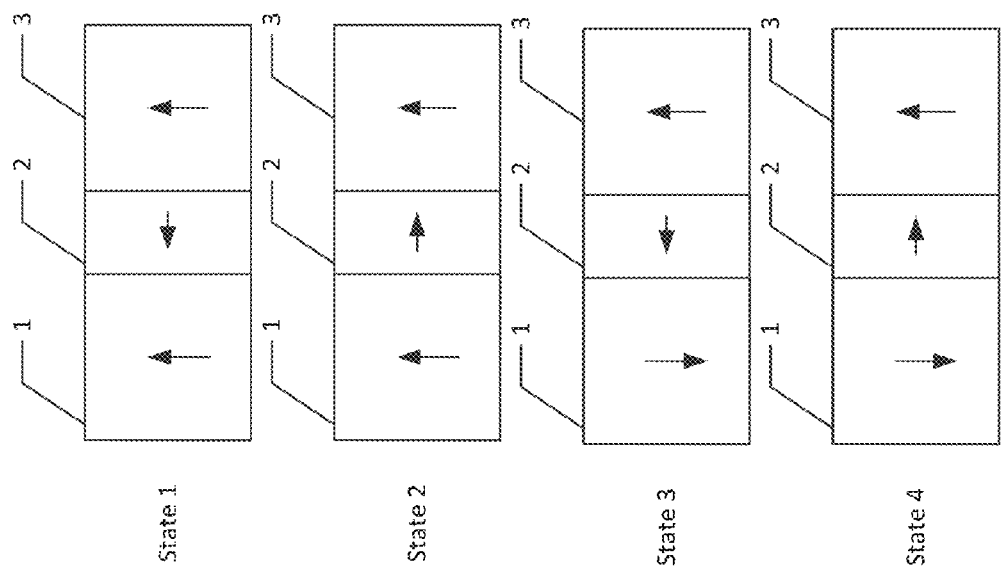
Figure 15:
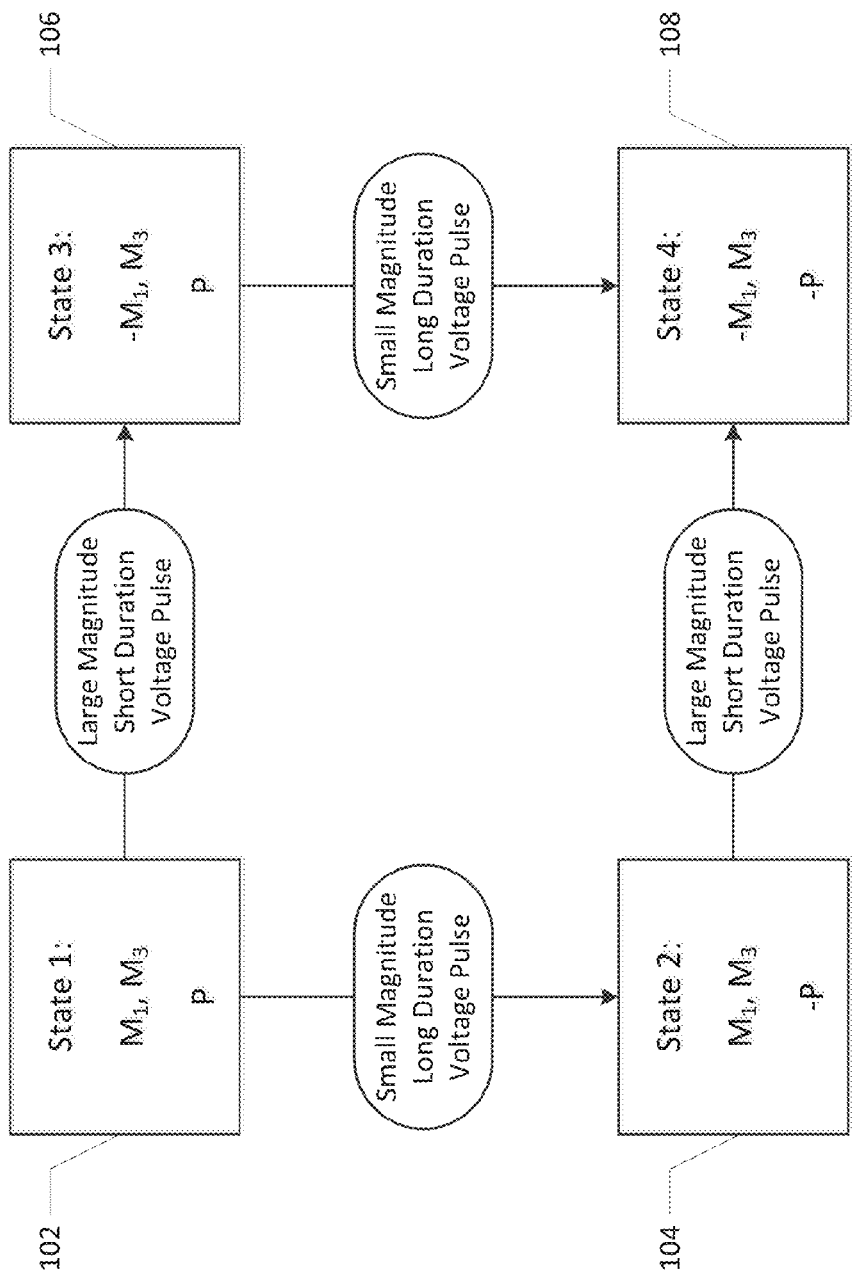
Figure 16:
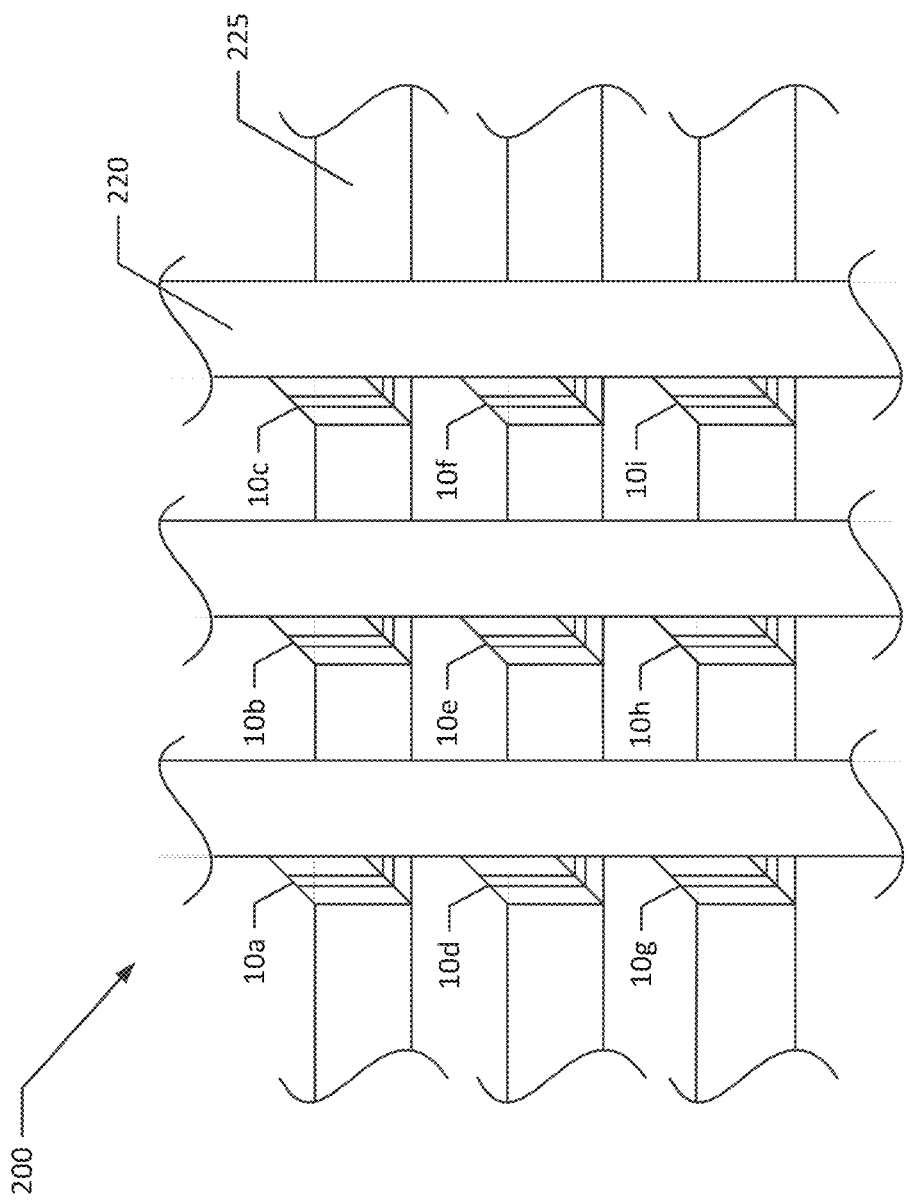

FIG. 12 is a block diagram of a multiferroic tunneling junction (MFTJ), in accordance with an embodiment of the present invention;

FIG. 13 is a schematic diagram of the magnetizations and ferroelectric polarization of an MFTJ, in accordance with an embodiment of the present invention;

FIG. 14 is a schematic diagram illustrating various states of an MFTJ, in accordance with an embodiment of the present invention;

FIG. 15 is a flowchart illustrating processes and operations that may be completed in association with various embodiments of the present invention; and FIG. 16 is a diagram illustrating how multiple MFTJs may be configured to provide a memory device, in accordance with an embodiment of the present invention.

DETAILED DESCRIPTION OF THE INVENTION

The present invention provides a novel method to control the spin current and the spin transfer torque (STT) by an electric field in a multiferroic tunnel junctions (MFTJs) with ferroelectric (FE) barriers. Switching the FE polarization in the barrier under an externally applied electric field dramatically affects the spin current. This in turn results in change of the magnitude and the sign of both components of the STT. Our calculations show that within different range of (1) bias voltage and (2) magnitude and direction of the ferroelectric polarization, the STT can increase by more than an order of magnitude or can be suppressed to zero. The STT enhancement will lead to a decrease in the charge current density necessary for switching and hence a dramatic improvement in energy efficiency. The STT quenching conversely is useful for logic applications. This bias- and polarization-tunability of the STT could be exploited in MRAM devices to improve the magnetization switching efficiency, which can further decrease the energy consumption. The bias control of the STT is proportional to the size of the ferroelectric polarization which provides a novel method to improve the efficiency of these MRAM devices. Moreover, the additional degrees of freedom provide new switching mechanisms and device paradigms.

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The device at the foundation of this invention, shown in FIG. 1, is a MFTJ consisting of two FM layers (or "slabs") separated by a composite FE barrier. The magnetization of the FM layers can be in plane or perpendicular to the plane. The magnetic layers are made of FM metals such as Co, Fe, FeCo, $(La,Sr)TiO_3$, etc. Regardless of the specific materials choice the key function is that the magnetic slabs possess spontaneous magnetizations, which are sufficiently decoupled by the non-magnetic barrier such that the magnetization of one of the layers can be freely rotated with respect to the other. Typically one of the layers, called the reference or pinned layer, is thicker and its magnetization is pinned at a particular direction by exchange coupling with an antiferromegnet (AFM). The magnetization of the second layer, the free layer, is free to rotate. The reference layer is responsible for producing the spin polarized current which in turn produces the STT in the free layer.

In FIG. 1, the barrier can consist of a single FE layer or a combination of dielectric insulating layers (I) and a FE layer, such as FE, I/FE, FE/I', or I/FE/I'. For the FE barriers, as shown in FIG. 1, typically perovskite ferroelectric oxides are utilized such as $(Ba,Sr)TiO_3$ or $Pb(Zr,Ti)O_3$. The key feature of the FE barrier is that it possesses a spontaneous electric polarization in the direction of the current or perpendicular to the layers, which can be switched by an external electric field. The switching voltage pulse typically has magnitude larger than the voltage at which the transport measurements are performed. The total thickness of the barrier is of the order of a few nanometers to allow for electron tunneling through it.

Such devices have already been elaborated in the literature. Their key property is that they change resistance in both magnetic and electric field, the TMR and TER effects, respectively. The origin of the TMR effect lies on the relative orientation of the magnetizations in the FM layers which determines the digital memory state of the bit. The TER effect originates from the change in the resistance upon reversal of the electric polarization of the FE barrier. In addition to the simultaneous presence of both effects in MFTJs, there is coupling between the TMR and TER effects in the sense that the value of TMR depends on the polarization direction in the FE barrier and conversely the value of TER depends on the relative orientation of the magnetizations in the FM layers. The existing knowledge both experimentally and theoretically is limited largely to the behavior of the TER and TMR at zero bias.

A necessary requirement to achieve the TER at zero bias is to break the inversion symmetry of the junction via, for example, use of different electrodes or interface terminations. Although the zero-bias behavior of the TER in ferroelectric-based tunnel junctions and the finite bias behavior of the TMR in MTJs with passive barriers (without electric polarization) and the finite bias behavior of the STT in MTJs with passive barriers (without electric polarization) has been the subject of intensive research both experimentally and theoretically, the finite bias behavior of the TER, the TMR, and the STT in MFTJs remain unexplored areas in the prior art. The current invention addresses the following phenomena, described in detail below: (1) The bias dependence of the TER in both symmetric MFTJs and asymmetric MFTJs with composite barriers; (2) The bias dependence of the TMR in both symmetric MFTJs and asymmetric MFTJs with composite barriers; and (3) The bias dependence of STT in both symmetric MFTJs and asymmetric MFTJs with composite barriers; and (4) The behavior of interlayer exchange coupling (IEC) in asymmetric MFTJs with composite barriers.

A. Electrostatic Potential in MFTJs with Composite Ferroelectric Barriers

The effects described below are governed by the interplay of the voltage and polarization in modifying the junction electrostatic potential profile. In order to determine the charge distribution and the potential energy profile in the MFTJ in the presence of polarization and applied bias we have generalized the spin-dependent screening model of Zhuravlev et al. to finite bias and the geometry as shown in FIG. 1. The total screening charge density is given by the following equation:

$$\sigma^s = \frac{1}{\varpi}(\kappa_D \kappa_{D'} Pa + \varepsilon_0 \kappa_F \kappa_D \kappa_{D'} \Delta V),$$

where $\varpi = a\kappa_D \kappa_{D'} + b\kappa_F \kappa_{D'} + b'\kappa_F \kappa_D + \kappa_F \kappa_D \kappa_{D'}(\lambda_L + \lambda_R)$ and $\kappa_X = \varepsilon_X/\varepsilon_0$ (X=D,D',F) is the relative dielectric constant, $\varepsilon_0$ is the dielectric permittivity of the vacuum, $\lambda_{L(R)}$ are the screening length of the left (right) electrode, a, b, b' are the widths of the ferroelectric and dielectric parts of the barrier, P is the ferroelectric polarization, and $\Delta V$ is the applied bias. The expressions for the particular geometries can be obtained from the one above with the necessary simplifications. For example, the screening charge for a composite I/FE barrier can be determined by setting the thickness of the second dielectric slab to zero (b'=0) and is of the form:

$$\sigma^s = \frac{\kappa_D Pa + \varepsilon_0 \kappa_F \kappa_D \Delta V}{a\kappa_D + b\kappa_F + \kappa_F \kappa_D (\lambda_L + \lambda_R)}.$$

Furthermore for a simple ferroelectric barrier (b=b'=0) and zero bias ($\Delta V$=0) the expression reduces to that of Zhuravlev et al.:

$$\sigma_P^s = \frac{P}{1 + \kappa_F(\lambda_L + \lambda_R)/a},$$

which is the polarization-induced contribution to the screening charge. At finite bias for the simple ferroelectric barrier we also have the bias-induced screening charge, $\sigma_V^s = \varepsilon_F E_{ext}/[1 + \kappa_F(\lambda_L + \lambda_R)/a]$, where $E_{ext} = \Delta V/a$ is the electric field due to the bias. Thus, the total induced screening charge is as $\sigma^s = \sigma_P^s + \sigma_V^s$. Depending on the sign of P and $\Delta V$ the two contributions can enhance or suppress the total screening charge density. For example, in FIG. 2(a) and FIG. 2(b) we display schematically the change of $\sigma_P^s$ and $\sigma_V^s$ for the same bias as the orientation of polarization switches from pointing right to left, resulting in a dramatic change of $\sigma^s$. From the expression of the screening charge the expressions for the electrostatic potential profile throughout the barrier and electrodes can be determined.

Specifically, FIG. 2(a) shows that when the polarization and the applied bias are in the opposite directions the screening charge produced by one partially cancels the screening charge produced by the other resulting in small overall screening charge. On the left and the right we show with lines the distribution of the screening charge due to polarization (light gray) and bias (darker gray), as well as the total screening charge (black). In the middle we show with bars the integrated total screening charge.

FIG. 2(b) shows that when the polarization and the applied bias are in the same direction the induced screening charges add to produce a large net screening charge.

B. Bias Dependence of TER

The TER effect in MFTJs arises from incomplete screening of polarization charges at the metal/barrier interfaces. The FE polarization introduces bound charge at the interfaces which are in turn screened by the spin-polarized free carriers in the metallic ferromagnetic slabs. Thus, the FE polarization significantly modifies the electrostatic potential across the junction resulting in substantial change of their transport properties. At zero bias for tunnel junctions with inversion symmetry switching the polarization direction does not lead to changes in the device conductance. On the other hand, in asymmetric junctions, i.e. with broken inversion symmetry, the two polarization directions are non-equivalent and hence the polarization profile and in turn the conductance depend on the polarization direction at zero bias.

In this invention we demonstrate a number of TER features which occur at finite bias and could be useful in MRAM memory applications: (1) the TER effect exists even in symmetric MFTJs at non-zero bias. This eliminates the need of sophisticated interface engineering to produce TER; (2) the TER effect is enhanced in asymmetric MFTJs with composite barriers. The asymmetry also causes TER to appear at zero bias; and (3) the bias behavior of the TER can be modulated by controlling the relative orientation of the magnetization of the electrodes (P or AP).

The dependence of TER on the applied bias is shown in FIG. 3(a) and FIG. 3(b) for a given polarization magnitude. For a symmetric MFTJ the TER vanishes at zero bias (FIG. 3(a)). However, at finite bias the TER is non-zero and increases with bias due to the bias-induced spatial inversion symmetry breaking. Namely, the different chemical potentials of the left and right electrodes influence the spin-dependent screening of the polarization, rendering the two polarization directions non-equivalent. The effect is similar to that in asymmetric tunnel junctions with different electrodes or interface terminations at zero bias. The important difference is that in MFTJs the asymmetry can be controlled dynamically by changing the bias. Thus, the TER can be controlled by varying the magnitude and sign of the external bias. For example, as shown in FIG. 3(a), the magnitude of TER increases with bias and the sign of TER can be reversed by reversing the electric field direction.

As shown in FIG. 3(b), for asymmetric MFTJs with a composite I/FE barriers the TER does not vanish at zero bias. FIG. 4(a) and FIG. 4(b) demonstrate that the magnitude of TER at zero bias is increased as the thickness of the dielectric layer increases. As shown in FIG. 4(a) and FIG. 4(b), in addition the absolute value of TER increases as the magnitude of the polarization increases. The mechanism of the larger effect of the composite barrier on the current (and TER/TMR) is the shift of the electrostatic potential in the dielectric. The potential is more or less flat in the dielectric and it is shifted up and down by switching the polarization. This shift changes the height of the dielectric barrier, which in turn has a strong effect on the current. Correspondingly the thicker the dielectric the larger the effect on the current is. And the larger the polarization the larger the shift of the electrostatic potential in the barrier.

As shown in FIG. 3(a) and FIG. 3(b), the TER also depends on the relative orientation of the magnetization in the electrodes. The results show that the TER effect is larger for the antiparallel (AP) alignment of the magnetizations of the electrodes compared to the parallel (P) alignment. This is due to the fact that in addition to the bias-induced shift of the Fermi level, the majority and minority spin channels in one of the electrodes are reversed. The polarization induced screening has larger effect on the minority channel which is closer to the Fermi level. Thus, in the parallel configuration, the polarization induced screening affects only one of the current channels, while in the AP configuration, the polarization induced screening affects both channels which results in a stronger effect in the AP configuration.

C. Bias Dependence of TMR

The bias behavior of the TMR has been extensively studied in MTJs with simple insulating barriers (e.g. MgO) where the barrier plays only a passive role in the spin-polarized transport. On the other hand, the TMR behavior in MFTJs has been investigated solely at zero bias.

In this invention we demonstrate a number of novel properties of the TMR in the presence of polarization that could have great potential for MRAM device applications: (1) the finite bias behavior of TMR in MFTJs can be modified dramatically by the presence of FE polarization in the barrier. The maximum TMR value, which occurs at zero bias for symmetric junctions shifts to non-zero bias for MFTJs with simple insulating barriers, rendering the TMR bias dependence linear at low bias rather than quadratic. Consequently, the TMR increases with bias instead of decreasing at low bias as in the case of simple insulating barriers (e.g. MgO); (2) the magnitude and even the sign of TMR can be toggled by switching the polarization direction; (3) For an asymmetric barrier, the zero-bias TMR takes two different values depending on the polarization direction. This TMR tunability is present throughout the entire bias widow and not only at zero bias.

The bias dependence of the TMR is shown in FIG. 5(a) for the simple symmetric FE barrier and is compared to that for a passive barrier (without polarization). In most conventional MTJs the current for the P state is larger than that one for the AP state in the experimental bias range rendering TMR positive. In the absence of ferroelectricity, the bias dependence of TMR in symmetric MTJs is symmetric. Namely, the bias dependence of TMR has a maximum value at zero bias and it decreases with bias, see FIG. 5(a), line labeled with open circles. On the other hand, the FE polarization in MFTJs breaks the inversion symmetry. The resulting behavior is similar to that of TMR in MTJs with physically asymmetric barriers. In this case the presence of the polarization charge induces screening charges at the interfaces which significantly modify the interface transmission probability for the electrons. This in turn modifies the behavior of TMR which is proportional to the product of the interface transmission probabilities at both interfaces.

The polarization shifts the maximum of TMR to finite bias rendering the low-bias behavior of TMR monotonous (FIG. 5a). Consequently, the TMR increases with bias and its sign reverses with changing the bias polarity. For a fixed voltage, reversing the polarization direction can dramatically change the magnitude and even induce a sign reversal of TMR. This demonstrates the TMR tunability as the polarization is switched under an applied electric field, where the TMR can change from a concave to a monotonic function of bias. This effect is proportional to the magnitude of the polarization.

As shown in FIG. 5(b), for asymmetric MFTJs with a composite I/FE barrier the picture is quite similar, except that the curves are shifted away from zero bias. As a result the TMR has two distinct values at zero bias corresponding to the two polarization directions, which is normally referred to as TMR tunability. This tunability is present not only at zero bias but throughout the bias range and in general increases with bias. The asymmetry also facilitates the toggling of the sign of TMR because the TMR sign reversal occurs at smaller bias.

D. Bias Dependence of STT

Switching of the magnetization of the free layer with respect to the other layer can be achieved either via an external magnetic field or a spin-polarized current which induces spin transfer torque (STT). The STT involves the transfer of spin angular momentum between the non-collinear magnetizations of the FM layers, which is more promising for electronic memory storage applications due to the simplification of the device architecture. The STT can be decomposed into two components with respect to the magnetizations plane: a spin-transfer (in-plane or parallel) component and a field-like (out-of-plane or perpendicular) component. At zero bias the in-plane torque vanishes, while the out-of-plane torque is non-zero and is related to the IEC. The IEC is defined as the difference in energy between the P and AP configurations. Although the bias behavior of STT in MTJs with passive barriers has been the subject of intensive research both experimentally and theoretically, exploiting the FE polarization switching to control the STT components in MFTJs has not been investigated thus far either experimentally or theoretically.

Although the bias behavior of STT in MTJs with passive barriers has been the subject of intensive research both experimentally and theoretically, exploiting the FE polarization switching to control the STT components in MFTJs has not been investigated thus far. The present invention demonstrates control of both STT components in MTJs with FE barriers by means of switching the direction of the polarization in the barrier. At certain values of the parameters the magnitude and even the sign of STT can be changed in real time by electric field by switching the barrier polarization. These properties can lead to lower switching currents and increased energy efficiency. The effect is due to the dependence of the interface transmission probabilities on the screening charge at the interfaces. We have identified two types of screening charge mechanisms responsible for the intriguing bias behavior of the STT: (1) the polarization-induced and (2) the bias-induced screening effect. The former is proportional to the polarization magnitude and changes between two discrete levels when the polarization direction changes. The latter is proportional to the applied bias and changes gradually under an external electric field. These two mechanisms can act cooperatively or competitively to produce the STT tunability.

More specifically, for the in-plane component of the STT: (1) the orientation of the polarization changes the slope of the STT curves; (2) the STT can be tuned between high and low values by switching the polarization direction under an applied electric field; (3) for some polarization values, STT can be quenched or released (off/on) by switching the polarization; and (4) for other polarization values, STT can be toggled between positive and negative values.

For the out-of-plane component of the STT: (1) the presence of polarization changes the STT bias behavior from quadratic to monotonous; (2) the STT can be tuned between low values and high values by polarization switching; (3) for some polarization values, the sign of STT can be toggled via an external electric field by switching the polarization in the barrier; and (4) the IEC depends on the polarization of the barrier and for asymmetric junctions it becomes a monotonous function of the polarization. Thus polarization switching leads to a large change in the IEC and in certain cases change of the sign of the IEC upon polarization switching.

1. Results for the Parallel (in-Plane) Component of STT:

The bias behavior of the parallel component of the STT is shown in FIG. 6(a) for the FE barrier case and is compared with that of the passive tunnel barrier. The STT without polarization is approximately a linear function in the experimental bias range. The FE polarization changes the slope of the STT curve where positive polarization increases it and negative polarization decreases it. Therefore for a fixed bias, the magnitude and even the sign of the STT can be changed by switching the polarization direction. For example, under positive bias, the STT can be switched from a large negative value (positive polarization) to almost zero (negative polarization). Similarly, under negative bias a sign reversal of the STT upon switching the ferroelectric polarization. As shown in FIG. 6(b), the effect of the asymmetric I/FE barrier is to enhance the effect of the negative polarization (towards the dielectric) and suppress the effect of the positive polarization (away from the dielectric).

In FIG. 8(a), the ratio of the parallel STT for negative and positive polarization, $T_\parallel(-)/T_\parallel(+)$ is displayed as a function of the applied bias. Negative polarization quenches the parallel STT throughout most of the bias window. This ratio is less than 1/5 for the positive bias range which indicates that STT can be reduced by a factor of 5 or more by reversing the polarization in the negative direction. Conversely it can be increased by a factor of 5 by reversing the polarization in the positive direction. Thus in a MFTJ switching the polarization direction can quench or release the STT. The asymmetry enhances this ratio making the STT tunability more extreme. For negative bias the switching ratio is negative which indicates that polarization switching toggles the sign of STT. Since under positive bias the switching ratio is positive, the STT ratio can be selectively tuned between a lower and higher value via polarization switching.

The polarization versus bias phase diagram of the in-plane STT for both the FM/FE/FM and FM/I/FE/FM tunnel junctions is shown in FIG. 9(a) and FIG. 9(c). The results reveal that for a given bias the magnitude of STT generally increases with the polarization. This result suggests that by increasing the polarization, e.g. by replacing $BaTiO_3$ with $PtTiO_3$ or by straining it on a substrate, the STT can be significantly enhanced, thus reducing the switching current. Moreover, if the polarization is large (>40 $\mu C/cm^2$) toggling the polarization at a given bias will toggle the sign of the STT. If the polarization is small (~0-20 $\mu C/cm^2$), it is possible for STT to retain the same sign, but the polarization switching to tune the magnitude of STT. Finally, there are regions of the plot for non-zero polarization (indicated by vertical lines) where STT can be quenched for a given polarization for most of the bias range. Reversing the polarization releases the STT to a large value.

2. Results for the Perpendicular (Out-of-Plane) Component of STT

Out-of-plane STT is similarly affected by polarization switching. The bias dependence of the perpendicular component of STT is shown in FIG. 7(a) for the FE case and is compared to that in the passive barrier. In contrast to the parallel STT, with passive barriers the perpendicular STT is a symmetric and quadratic function of the bias. The non-zero value at zero bias is the IEC. Upon subtracting the zero-bias value the bias-induced STT is a convex function which vanishes at zero bias and increases quadratically with bias. The polarization-induced screening shifts the minimum of the STT to higher or lower bias depending on the direction of the polarization and changes in turn its bias behavior from quadratic to monotonic in the experimental bias range. One advantage of the monotonic bias behavior is that in the presence of polarization both the parallel and the perpendicular STT increase monotonically with bias, thus allowing for the synergistic operation of both components leading to an improved switching efficiency. In the case of a composite I/FE barrier, shown in FIG. 7(b), the graphs are shifted to the left thus producing two different values of the IEC at zero bias depending on the polarization direction.

Another important prediction is that the bias-induced field-like component of the STT, can be toggled by switching the polarization direction. The enhancement of the bias-induced part of STT is shown in FIG. 8(b). Under negative bias the enhancement is negative indicating that the out-of-plane of the STT can be toggled via switching the polarization direction. Furthermore, the enhancement can be tuned gradually by the bias to more than an order of magnitude in either direction. The asymmetry induced by the composite I/FE only slightly enhances the ratio.

Accounting for the IEC, the full perpendicular STT can be enhanced or suppressed by the presence of the polarization compared to that in the passive barrier case. For example, in FIG. 7(a), for values of the bias less than 0.5 V switching the polarization direction changes the value of the STT from a smaller negative value (positive polarization) to a larger negative value (negative polarization). For bias values above 0.5 V, the sign of STT is toggled by polarization switching. As shown in FIG. 7(b), the asymmetry produced by a composite I/FE barrier shifts the curves to negative bias but leaves the behavior mostly unchanged. Thus, the composite I/FM barrier asymmetry shifts the STT curve and allows the toggling to occur at much smaller bias.

The polarization versus bias phase diagram of the bias-induced part of the perpendicular STT is shown in FIG. 9(b) and FIG. 9(d). Similarly to the parallel component of the STT and for a large enough polarization the sign of the out of plane STT can be toggled upon polarization switching at a fixed bias. For small polarization it is possible for STT to retain its sign and change only its magnitude. Also there is a range of polarization where the perpendicular component of the STT can be quenched. Interestingly, within this range of intermediate polarization (~20 $\mu C/cm^2$) the parallel STT is also quenched raising the possibility to be able to completely switch off the torque by polarization switching.

Finally the polarization dependence of the IEC is shown in FIG. 10(a) for the FM/FE/FM tunnel junction, and in FIG. 10(b) for FM/FE/I/FM tunnel junction. As shown in FIG. 10(a) and FIG. 10(b), the IEC depends significantly on the polarization magnitude. For symmetric junctions the dependence is quadratic while in asymmetric MFTJs with I/FE barriers the dependence is monotonous. Consequently, switching the polarization direction produces a large change in the IEC. Since the IEC governs with the relative orientation of the magnetizations of the two FM slabs at zero bias the polarization dependence of the IEC for composite barrier junctions may be important for magnetic switching.

To investigate whether the ground state can be switched from P to AP by polarization switching we plot in FIG. 11 the phase diagram of the IEC with polarization and dielectric barrier (I) height. We find that if the barrier height is small enough the polarization can switch the dielectric layer between insulating and metallic state which dramatically changes the IEC. Thus, under certain conditions the IEC can change sign thus promoting switching of the relative orientation of the electrodes between parallel and antiparallel even at zero bias.

E. Preferred Embodiments of the Invention

FIG. 12 and FIG. 13 illustrate a multiferroic tunnel junction (MFTJ) 10. The MFTJ comprises a first ferromagnetic slab 1, a thin ferroelectric barrier 2 which could be composite i.e. made of dielectric and ferroelectric layers, and a second ferromagnetic slab 3. The ferromagnetic slabs 1, 3 are in electrical communication with leads 5, 6. The electrical leads 5, 6 may be used to provide a voltage bias V across the MFTJ, to read information/data stored in the MFTJ, to secure the MFTJ into electrical communication with other circuit components, and/or the like. In various embodiments, the magnetic slabs 1, 3 may be made of various magnetic metals. For example, in FIG. 12 and FIG. 13, the magnetic slabs 1, 3 may be made of Co, Fe, FeCo, $(La,Sr)MnO_3$, and or the like. Each magnetic slab 1, 3 may have a magnetization $M_1$, $M_3$. In various embodiments, the second magnetic slab 3 may be a reference or pinned layer. For example, the magnetization $M_3$ may be fixed and/or the direction of the magnetization $\hat{M}_3 \equiv M_3/M_3$ may be fixed. For example, in some embodiments, magnetic slab 3 may be coupled to an antiferromagnet (e.g., a slab of Cr, $FeO_3$, IrMn, NiO, etc.) 7 such that the magnetization $M_3$ or the direction of the magnetization $\hat{M}_3$ is fixed. In some embodiments, the second magnetic slab 3 may be thicker than the first magnetic slab 1. The magnetization $M_1$ of the first magnetic slab may be free to rotate with respect to $M_3$. In various embodiments, the magnetizations $M_1$, $M_3$ may be either parallel or perpendicular to the plane of the interface between the ferromagnetic slab and the ferroelectric tunnel barrier.

In various embodiments, the ferroelectric barrier 2 (as shown in FIG. 12 and FIG. 13) may be made of a single slab of ferroelectric material such as $(Ba,Sr)TiO_3$, $Pb(Zr,Ti)O_3$, and/or other perovskite ferroelectric oxides or other ferroelectric materials. In some embodiments the barrier 2 can be composite made of a slab of a ferroelectric material and one or two slabs of a dielectric materials such as $SrTiO_3$, in the following configurations I/FE, FE/I', or I/FE/I', The ferroelectric part of the barrier 2 may be configured to possess a spontaneous electric polarization P. The electric polarization P may be configured to point in the direction of an electrical current through the ferroelectric barrier 2 and/or pointing approximately from one magnetic slab toward the other magnetic slab. For example, the electric polarization P may point from the first magnetic slab 1 to the second magnetic slab 3 (herein referred to as a first orientation $P_1$) or from the second magnetic slab 3 to the first magnetic slab 1 (herein referred to as a second orientation $P_2$). In various embodiments, the voltage pulse required to switch the direction of electric polarization P from $P_1$ to $P_2$ is smaller in magnitude and longer in duration than the voltage pulse used to switch the relative magnetization orientation. Both voltages are significantly larger than the voltage required to measure various parameters of the MFTJ 10 described below. For example, the voltage required to switch the direction of electric polarization P from $P_1$ to $P_2$, or vice versa, is larger than the voltage used to read the bit(s) embodied by the MFTJ 10.

In various embodiments (as shown in FIG. 12 and FIG. 13), the thickness of the thin ferroelectric barrier 2 is approximately a few angstroms to a few nanometers. For example, the ferroelectric barrier 2 may be 0.2 nanometers to 4 nanometers thick. In various embodiments, the ferroelectric barrier 2 may be thick enough to support polarization and thin enough that electronic tunneling is possible. In various embodiments, the magnetic slabs 1, 3 are thick in comparison to the ferroelectric barrier 2. For example, the magnetic slabs may each be approximately 1 nanometer to 100 nanometers thick. In various embodiments, the thickness of the first 'free' ferromagnetic slab 1 may be approximately 1 nanometer to 5 nanometers and the thickness of the second 'pinned' ferromagnetic slab 3 may be thicker than the thickness of the first ferromagnetic slab 1. In one example embodiment, the thickness of the first ferromagnetic slab 1 is 3 nanometers and the thickness of the second ferromagnetic slab 3 is 80 nanometers. In various embodiments, the MFTJ 10 may or may not have inversion symmetry across a symmetry plane parallel to the interface between the first magnetic slab 1 and the ferroelectric barrier 2, between the ferroelectric barrier 2 and the second magnetic slab 3, and/or perpendicular to the direction of the current across the junction, and disposed within the ferroelectric barrier 2. In various embodiments, the tunnel barrier may also be a composite barrier consisting of a dielectric thin film in contact with the ferroelectric thin film.

In various embodiments, the resistance across the MFTJ 10 may be used to determine the state of the MFTJ. For example, the resistance may depend on the relative orientation of $M_1$ and $M_3$ and/or on the direction of P. The relative size of the current or resistance due to the relative orientation of $M_1$ and $M_3$ is described by the tunneling magnetoresistance (TMR), which is defined as $TMR=(I_P-I_{AP})/(I_P+I_{AP})$, where $I_P$ is the current when $M_1$ and $M_3$ are parallel and $I_{AP}$ is the current when $M_1$ and $M_3$ are anti-parallel, for the same bias voltage V. Bias behavior of TMR can be controlled by the ferroelectric polarization direction, namely switching the polarization P can change the TMR, as illustrated in FIG. 5.

The relative size of the current or resistance due to the orientation of P is described by the tunneling electroresistance (TER), which is defined as $TER=(I_\rightarrow-I_\leftarrow)/(I_\rightarrow+I_\leftarrow)$, where $I_\rightarrow$ is the current when the polarization P is in the first orientation $P_1$ and $I_\leftarrow$ is the current when the polarization P is in the second orientation $P_2$, for the same bias voltage V. The bias behavior of the TER depends on the relative orientation/alignment of the magnetizations (M). Switching the relative orientation of the magnetizations can change the TER as illustrated in FIG. 3. In various embodiments, the TMR effect and the TER effect may occur simultaneously and may result in a four state system. In various embodiments, the system may provide a four state system even if the MFTJ 10 has inversion symmetry as described above (in particular, $M_1=M_3$, simple FE barrier, and/or the like).

FIG. 14 illustrates the four states of MFTJ 10. State 1 is characterized by parallel magnetizations in the magnetic slabs and polarization in the barrier pointing to the left. State 2 has parallel magnetizations in the magnetic slabs and polarization in the barrier pointing to the right. State 3 has antiparallel magnetizations in the magnetic slabs and polarization in the barrier pointing to the left. State 4 has antiparallel magnetizations in the magnetic slabs and polarization in the barrier pointing to the right. For a positive bias and for the configuration where $M_1$ is parallel to $M_3$, the TER may be positive. For example, for a positive bias and for the configuration where $M_1$ is parallel to $M_3$, the resistance across the MFTJ 10 in state 1 $R_1$ may be larger than the resistance across the MFTJ 10 in state 2 $R_2$ ($R_1>R_2$). In various embodiments, for positive bias and for the configuration where $M_1$ is antiparallel to $M_3$, the TER may also be positive. For example, for a positive bias, the resistance across the MFTJ 10 in state 3 $R_3$ is larger than the resistance across the MFTJ 10 in state 4 $R_4$ ($R_3>R_4$). Additionally, in various embodiments, the TER for the configuration where $M_1$ is antiparallel to $M_3$ is larger than that for the configuration where $M_1$ is parallel to $M_3$ (e.g., $R_4>R_2$). Thus, in various embodiments, toggling the relative orientation of the magnetizations $M_1$ and $M_3$ via a magnetic field controls the TER. For various embodiments, upon bias reversal, the TER for both the parallel and antiparallel configuration reverses sign. Thus, for negative bias the resistance across the MFTJ 10 in state 1 $R_1$ is smaller than the resistance across the MFTJ 10 in state 2 $R_2$ ($R_1<R_2$). In addition for negative bias the resistance across the MFTJ 10 in state 3 $R_3$ is smaller than the resistance across the MFTJ 10 in state 4 $R_4$ ($R_3<R_4$).

As described in more detail in FIG. 5(a) and FIG. 5(b), in various embodiments, the bias behavior of the tunnel magnetoresistance (TMR) may be tuned by switching the ferroelectric polarization. Also, according to various embodiments, the sign of the TMR may reverse at large bias. As illustrated in FIG. 5, in various embodiments, when polarization is present, the TMR curves for various polarizations P are monotonous and have the opposite slope for polarizations $P_1$ and $P_2$. Therefore, in various embodiments, for positive bias the TMR for positive polarization (e.g., $P_1$) is smaller than the TMR for negative polarization (e.g., $P_2$). For example, for a positive bias, $R_1>R_2$. In various embodiments, for larger positive bias the TMR for positive polarization may reverse sign. As further shown in FIG. 5(a) and FIG. 5(b), in various embodiments, for negative bias the TMR for positive polarization is larger than the TMR for negative polarization. For more negative bias the TMR for negative polarization may reverse sign. Thus, in various embodiments, the TMR may be tunable via switching the ferroelectric polarization under an applied field. Additionally, in various embodiments, the effect is proportional to the magnitude of the polarization. Therefore, by measuring the resistance across the MFTJ 10, the state of the MFTJ 10 may be determined.

Thus, by controlling the bias voltage, the relative orientation of the magnetizations $M_1$ and $M_3$, and the direction of the polarization P, the state of the MFTJ 10 may be controlled and/or determined. For example, in various embodiments, the MFTJ 10 may be transitioned between states by switching the direction of the magnetization $\hat{M}_1$ and/or the direction of the polarization $\hat{P}$. As noted above, the polarization may be switched between the first orientation $P_1$ and the second orientation $P_2$, and vice versa, via an external electric field (e.g., by application of an appropriate voltage pulse across the MFTJ 10). Thus, in various embodiments, the MFTJ 10 may be switched from state 1 to state 2, or vice versa, or from state 3 to state 4, or vice versa, by the application of an external electric field or voltage pulse.

In various embodiments of the invention, the direction of the magnetization $\hat{M}_1$, and therefore the relative orientation of $M_1$ and $M_3$, may be switched via application of an external magnetic field. However, use of the external magnetic field to change the direction of magnetization $\hat{M}_1$ may be energy inefficient and may prevent placing two or more MFTJs 10 in close proximity. In various embodiments, the spin transfer torque (STT) may be used to affect the direction of the magnetization $\hat{M}_1$.

For example, as shown in FIG. 14, a spin current (e.g., a current of electrons each having an intrinsic spin) may pass across the MFTJ 10. Using the example of a current of electrons, the spin of each electron may couple to the magnetization $M_1$ such that the spin of the electron and $M_1$ exert a torque upon each other. If the current of electrons has randomly oriented spins (e.g., when the net current of spin is approximately zero), the net result of the spin transfer torque on $M_1$ may be small and/or insignificant. However, as shown in FIG. 14, if the spins of the current of electrons are aligned (e.g., when the net current of spin is non-zero), the net result of the spin transfer torque can be large enough to switch the MFTJ 10 from state 1 to state 3, or vice versa, or from state 2 to state 4, or vice versa.

As a current pass through the second magnetic slab 3, the spin of the current may experience a spin transfer torque, causing the spins of the particles in the current (e.g., electrons) to become aligned. The polarization P may boost or detract from the spin current, depending on the magnitude and direction of the polarization P and the bias voltage V. Thus, in various embodiments, the spin transfer torque may be suppressed to approximately zero or increased by an order of magnitude or more based on the magnitude and direction of the polarization P and the bias voltage V, as illustrated in FIGS. 8 and 9. This may allow, in various embodiments, control of the effectiveness of the spin transfer torque in affecting the magnetization $M_1$.

FIG. 15 provides a schematic diagram indicating how the MFTJ 10 may be switched between various states. By controlling the type of material, the dimensions of the slabs, and the size and duration of the voltage pulses, switching regimes may be engineered such as the polarization and magnetization are switched independently. For example, an MFTJ 10 starting in state 1 may be switched to state 2 (e.g., from block 102 to block 104) by applying a small magnitude, long duration voltage pulse. The small magnitude, long duration pulse may cause the direction of the polarization P to switch, while not producing sufficient spin transfer torque to affect the relative orientation of magnetizations $M_1$ and $M_3$. Similarly, an MFTJ may be switched from state 2 to state 4 (e.g., from block 106 to block 108) by applying a small magnitude, long duration voltage pulse.

As shown in FIG. 15, an MFTJ 10 may be switched from state 2 to state 4 (e.g., from block 104 to block 108) by applying a large magnitude, short duration voltage pulse. For example, the large magnitude, short duration voltage pulse may produce enough spin transfer torque to cause the relative orientation of $M_1$ and $M_3$ to switch (e.g., causing $M_1$ to switch to $-M_1$) while not affecting the direction of the polarization P due to the short timescale. Similarly, an MFTJ 10 starting in state 1 may be switched to state 3 (e.g., from block 102 to block 106) by applying a large magnitude, small duration voltage pulse. An MFTJ 10 may be switched from state 1 to state 4 (e.g, block 102 to block 108) by applying a large magnitude, short duration voltage pulse followed by a small magnitude, long duration voltage pulse (e.g., from block 102 to block 106 to block 108) or by applying a small magnitude, long duration voltage pulse followed by a large magnitude, short duration voltage pulse (e.g., from block 102 to block 104 to block 108). In various embodiments, an MFTJ 10 may be switched from state 2 to state 1 (e.g., from block 104 to block 102) by applying a small magnitude, long duration voltage pulse with the opposite sign of the voltage pulse used to switch the MFTJ from state 1 to state 2 (e.g., from block 102 to block 104). Similarly, an MFTJ 10 may be switched from state 4 to state 3 (e.g., from block 108 to block 106) by applying a small magnitude, long duration voltage pulse with the opposite sign of the voltage pulse used to switch the MFTJ from state 3 to state 4 (e.g., from block 106 to block 108). Also, an MFTJ 10 in state 3 may be switched to state 1 (e.g., from block 106 to block 102) by applying a large magnitude, short duration voltage pulse with the opposite sign of the voltage pulse used to switch the MFTJ from state 1 to state 3 (e.g., from block 102 to block 106).

Thus, to move backwards along the arrows illustrated in FIG. 15, a voltage pulse having the opposite sign of the voltage pulse used to move forward along the illustrated arrows may be implemented. Herein, the term a large magnitude voltage pulse is used to describe a voltage pulse that is larger than a small magnitude voltage pulse. Similarly, the term a long duration voltage pulse is used herein to describe a voltage pulse having a longer duration than a short duration voltage pulse. For example, the high magnitude, short duration pulse used to switch the relative orientation of magnetizations $M_1$ and $M_3$ may produce enough spin transfer torque to switch the direction of magnetization $M_1$ but is not long enough in duration to switch the direction of the polarization P. Also, the small magnitude, long duration pulse used to switch the direction of the polarization P may be of long enough duration to switch the direction of the polarization P but not of high enough voltage to provide enough spin transfer torque to switch the magnetization of $M_1$. Both 'writing' (or 'switching') voltages are larger than the voltage pulse necessary to read the information in the bit.

As shown in FIG. 16, two or more MFTJs 10 may be placed in parallel and/or some other configuration to provide at least a portion of a computer memory chip. For example, two or more MFTJs 10 may be fabricated on a single board. In various embodiments, two or more MFTJs 10 may be configured to provide an MRAM memory device. For example, FIG. 16 illustrates at least a portion of an MRAM memory chip 200. MFTJs 10a-10i are in communication with bit lines 220 and word lines 225. The bit lines 220 and word lines 225 may be configured write and/or read information/data to and/or from the MFTJs 10a-10i. For example, the bit lines 220 and word lines 225 may be configured write and/or read one or two bits of information/data to and/or from each of the MFTJs 10a-10i. Thus, information/data may be written to and/or read from MRAM memory chip 200.

In various embodiments, two or more MFTJs 10 may each be placed in communication with additional circuit or computer elements. For example, as shown in FIG. 16, the MRAM memory chip 200 may be in communication with a processing element (also referred to as processors, processing circuitry, and/or similar terms used herein interchangeably) that communicate with other elements computer elements via a bus. As will be understood, the processing element may be embodied in a number of different ways. For example, the processing element may be embodied as one or more complex programmable logic devices (CPLDs), microprocessors, multi-core processors, coprocessing entities, application-specific instruction-set processors (ASIPs), and/or controllers. Further, the processing element may be embodied as one or more other processing devices or circuitry. The term circuitry may refer to an entirely hardware embodiment or a combination of hardware and computer program products. Thus, the processing element may be embodied as integrated circuits, application specific integrated circuits (ASICs), field programmable gate arrays (FPGAs), programmable logic arrays (PLAs), hardware accelerators, other circuitry, and/or the like. As will therefore be understood, the processing element may be configured for a particular use or configured to execute instructions stored in volatile or non-volatile media or otherwise accessible to the processing element. As such, whether configured by hardware or computer program products, or by a combination thereof, the processing element may be capable of performing various steps or operations when configured accordingly.

As shown in FIG. 16, in various embodiments, the MRAM memory chip 200 may be in communication with one or more volatile or non-volatile memory devices (e.g., hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, MRAM, and/or the like). In some embodiments, the MRAM memory chip 200 may communicate with one or more computer elements via a bus, and/or the like.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

We claim:

1. A method of producing tunneling electroresistance (TER) effect in a multiferroic tunnel junction (MFTJ) at finite bias comprising:
   sandwiching a ferroelectric (FE) barrier between a first ultrathin ferromagnetic layer and a second ultrathin ferromagnetic layer;
   pinning the first ultrathin ferromagnetic layer, wherein a FE polarization is created in said FE barrier; and
   switching the FE polarization in the FE barrier while not switching the first and second ferromagnetic layer's magnetic polarization.

2. The method according to claim 1, wherein the MFTJ is asymmetric.

3. The method according to claim 1, wherein the MFTJ is symmetric.

4. The method according to claim 1, wherein the FE barrier is a composite asymmetric dielectric/ferroelectric barrier, and wherein the FE polarization is created in the composite asymmetric dielectric/ferroelectric barrier.

5. The method according to 4, wherein said composite asymmetric dielectric/ferroelectric barrier comprises one of a ferroelectric barrier in contact to a left insulating material, a ferroelectric barrier in contact with a right insulating material, and a ferroelectric barrier in contact to both a left insulating material and to a right insulating material.

6. The method according to claim 1, wherein switching the FE polarization includes applying an external electric field pulse.

7. A method of producing a monotonous bias dependence of a tunneling magnetoresistance (TMR) effect in a multiferroic tunnel junction (MFTJ) comprising:

sandwiching a ferroelectric (FE) barrier between a first ultrathin ferromagnetic layer having a first ferromagnetic orientation and a second ultrathin ferromagnetic layer having a second ferromagnetic orientation;

pinning the first ultrathin ferromagnetic layer, wherein a FE polarization is created in the FE barrier; and switching the first ferromagnetic orientation relative to the second ferromagnetic orientation while not changing the FE polarization in the FE barrier.

8. The method according to claim 7, wherein the monotonous bias dependence of TMR effect has a slope, and the slope is controlled by changing the FE polarization by applying an external electric field pulse.

9. An electric-field-controlled magnetoresistive memory element including a multiferroic tunnel junction (MFTJ) with magnetic electrodes and one of a simple and a composite ferroelectric barrier, the MFTJ produced according a method recited in claims 1, 2, 3, 4, 6, 7, and 8.

* * * * *